United States Patent [19]
Smith et al.

[11] Patent Number: 5,989,936
[45] Date of Patent: Nov. 23, 1999

[54] MICROELECTRONIC ASSEMBLY FABRICATION WITH TERMINAL FORMATION FROM A CONDUCTIVE LAYER

[75] Inventors: John W. Smith, Palo Alto; Joseph Fjelstad, Sunnyvale, both of Calif.

[73] Assignee: Tessera, Inc., San Jose, Calif.

[21] Appl. No.: 08/989,312

[22] Filed: Dec. 12, 1997

Related U.S. Application Data

[60] Continuation-in-part of application No. 08/440,665, May 15, 1995, Pat. No. 5,801,441, which is a division of application No. 08/271,768, Jul. 7, 1994, Pat. No. 5,518,964, and a continuation-in-part of application No. 08/885,238, Jun. 30, 1997, which is a continuation-in-part of application No. 08/366,236, Dec. 29, 1994, abandoned.
[60] Provisional application No. 60/032,828, Dec. 13, 1996.

[51] Int. Cl.$^6$ .......................... H01L 21/44; H01L 21/48; H01L 21/50
[52] U.S. Cl. .......................... 438/106; 438/118; 438/127
[58] Field of Search ...................................... 438/106, 118, 438/127

[56] References Cited

U.S. PATENT DOCUMENTS

| | | |
|---|---|---|
| 4,067,104 | 1/1978 | Tracy . |
| 4,642,889 | 2/1987 | Grabbe . |
| 4,955,523 | 9/1990 | Calomagno et al. . |
| 5,067,007 | 11/1991 | Kanji et al. . |
| 5,133,495 | 7/1992 | Angulas et al. . |
| 5,148,265 | 9/1992 | Khandros et al. . |
| 5,148,266 | 9/1992 | Khandros et al. . |
| 5,203,075 | 4/1993 | Angulas et al. . |
| 5,258,330 | 11/1993 | Khandros et al. . |
| 5,316,788 | 5/1994 | Dibble et al. . |
| 5,346,861 | 9/1994 | Khandros et al. . |
| 5,398,863 | 3/1995 | Grube et al. . |
| 5,455,390 | 10/1995 | DiStefano et al. . |
| 5,518,964 | 5/1996 | DiStefano et al. . |
| 5,525,545 | 6/1996 | Grube et al. . |
| 5,557,501 | 9/1996 | DiStefano et al. . |
| 5,590,460 | 1/1997 | DiStefano et al. . |
| 5,615,824 | 4/1997 | Fjelstad et al. . |
| 5,650,914 | 7/1997 | DiStefano et al. . |
| 5,679,977 | 10/1997 | Khandros et al. . |
| 5,688,716 | 11/1997 | DiStefano et al. . |

*Primary Examiner*—John F. Niebling
*Assistant Examiner*—Josetta I. Jones
*Attorney, Agent, or Firm*—Lerner, David, Littenberg, Krumholz & Mentlik, LLP

[57] ABSTRACT

A structure including a conductive, preferably metallic conductive layer is provided with leads on a bottom surface. The leads have fixed ends permanently attached to the structure and free ends detachable from the structure. The structure is engaged with a microelectronic element such as a semiconductor chip or wafer, the free ends of the leads are bonded to the microelectronic element, and the leads are bent by moving the structure relative to the microelectronic element. Portions of the conductive layer are removed, leaving residual portions of the conductive layer as separate electrical terminals connected to at least some of the leads. The conductive layer mechanically stabilizes the structure before bonding, and facilitates precise registration of the leads with the microelectronic element. After the conductive layer is converted to separate terminals, it does not impair free movement of the terminals relative to the microelectronic element.

28 Claims, 12 Drawing Sheets

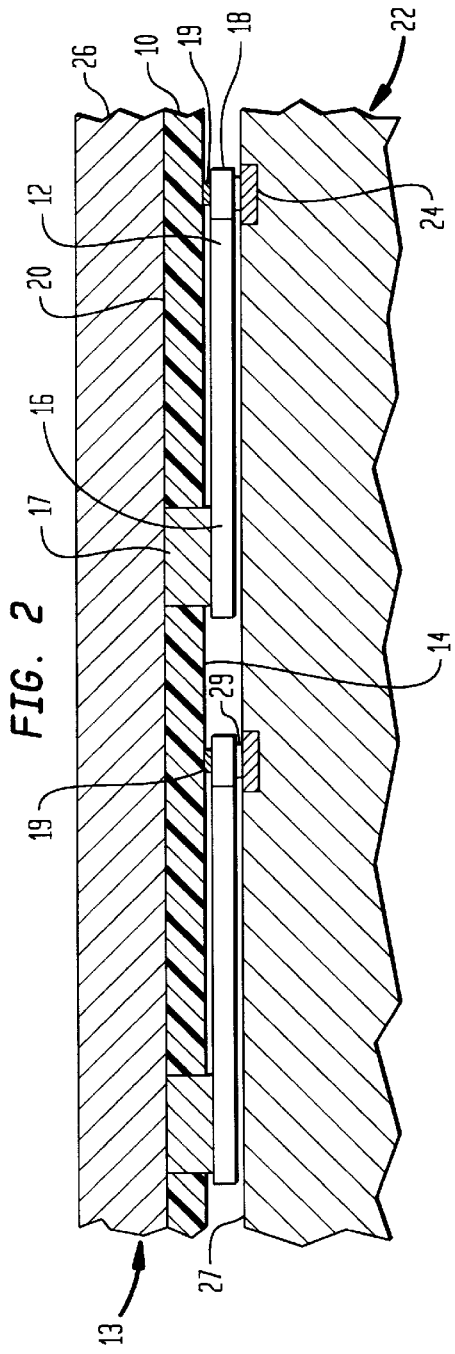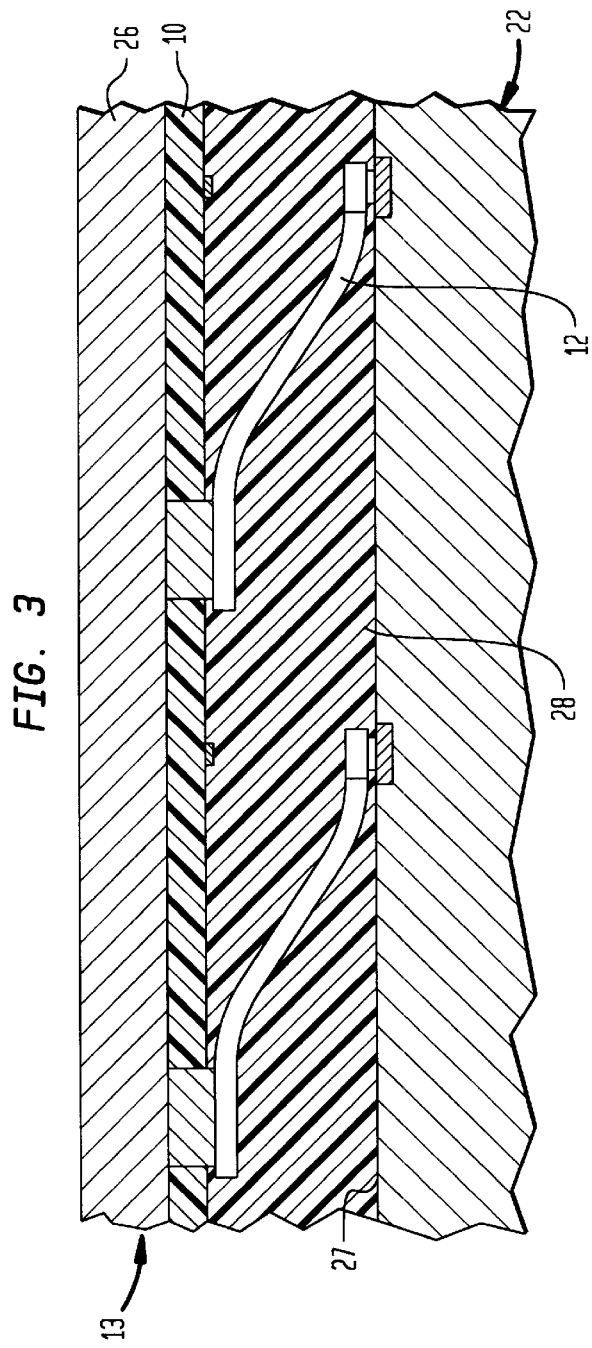

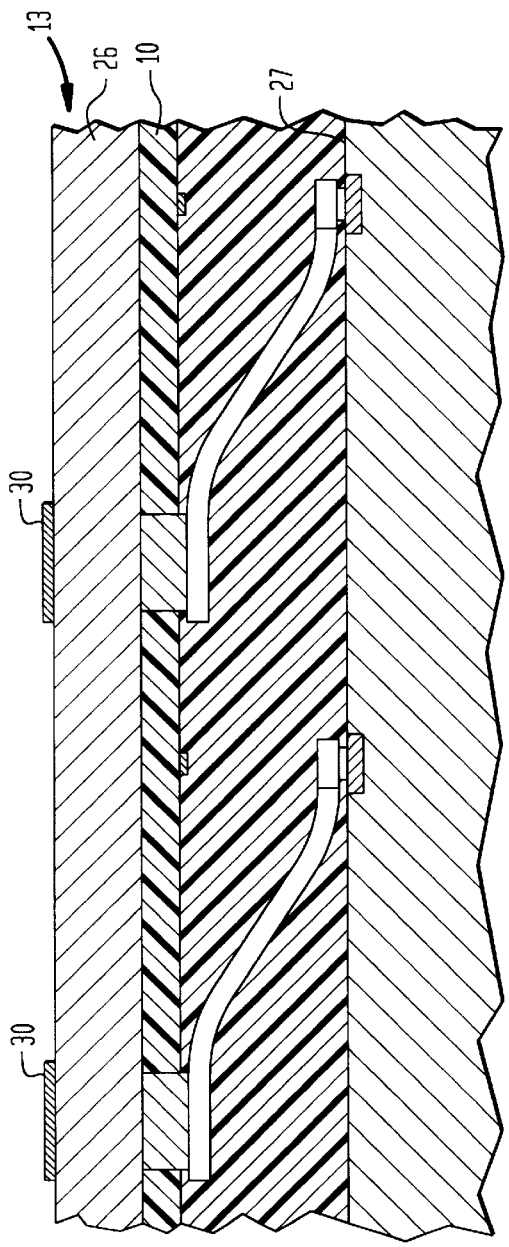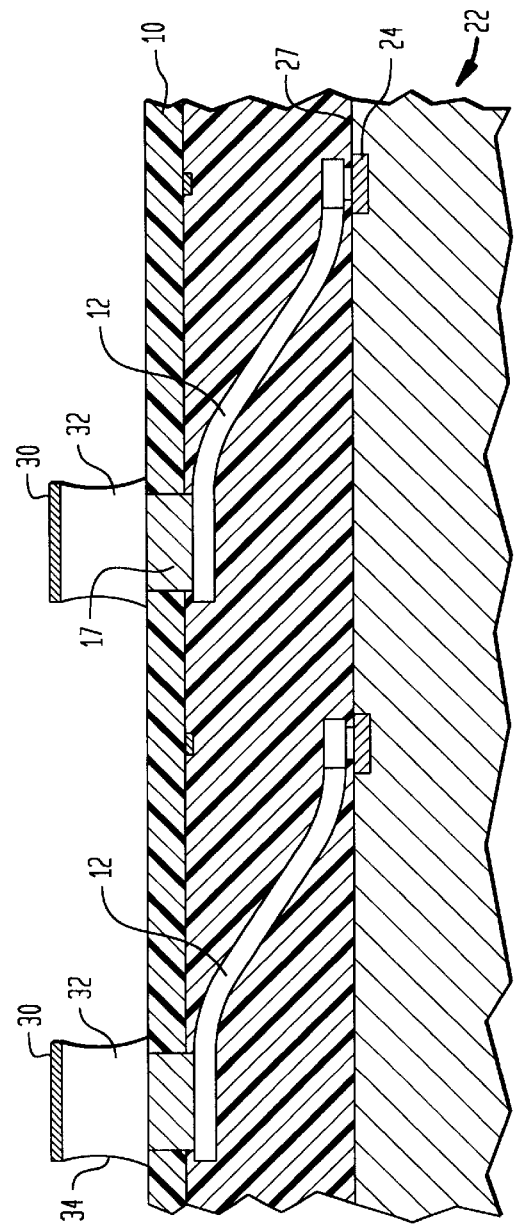

FIG. 16A
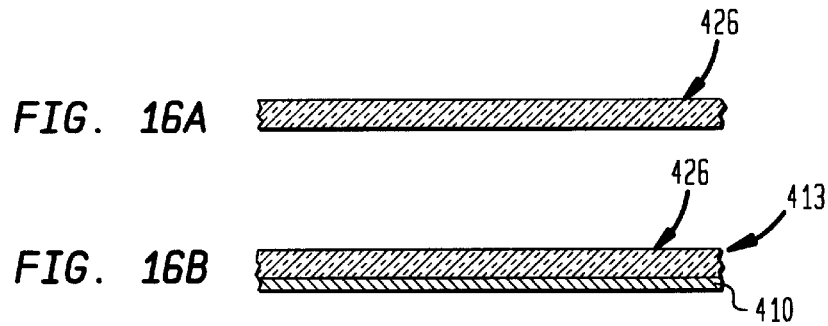
FIG. 16B
FIG. 16C
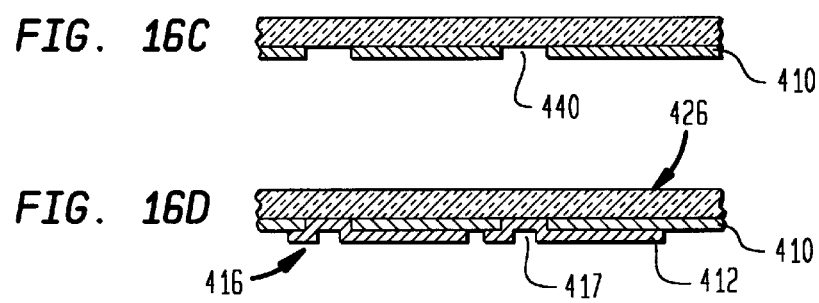
FIG. 16D
FIG. 16E
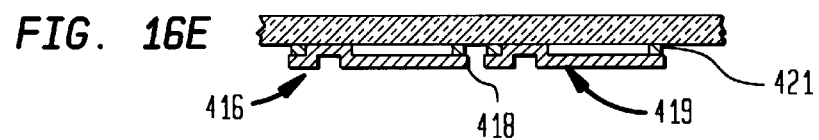
FIG. 16F
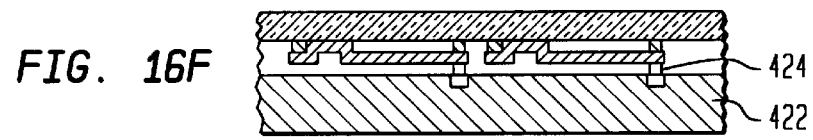
FIG. 16G
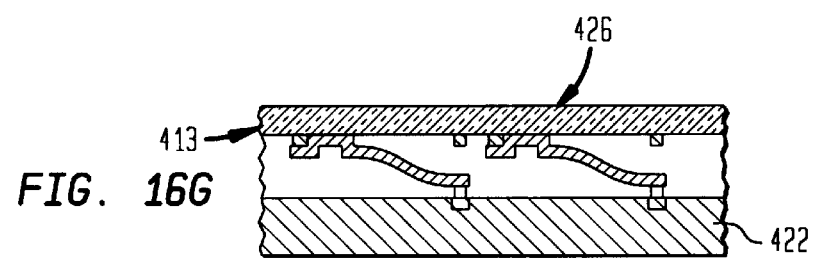
FIG. 16H
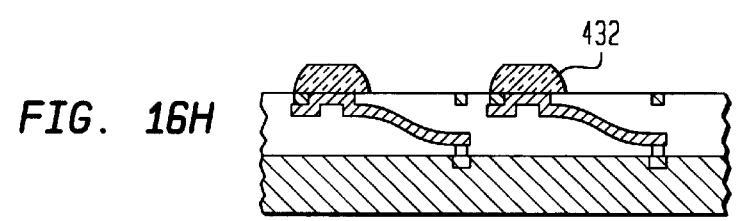

MICROELECTRONIC ASSEMBLY FABRICATION WITH TERMINAL FORMATION FROM A CONDUCTIVE LAYER

CROSS REFERENCE TO RELATED APPLICATIONS

The present application claims benefit of U.S. Provisional Patent Application 60/032,828, filed Dec. 13, 1996. The present application is also a continuation-in-part of U.S. patent application Ser. No. 08/440,665, filed May 15, 1995, now U.S. Pat. No. 5,801,441, which in turn is a divisional of U.S. patent application Ser. No. 08/271,768, filed Jul. 7, 1994, now U.S. Pat. No. 5,518,964. The present patent application is also a continuation-in-part of U.S. patent application Ser. No. 08/885,238, filed Jun. 30, 1997, which in turn is a continuation of U.S. patent application Ser. No. 08/366,236, filed Dec. 29, 1994, now abandoned. The disclosures of all of the aforesaid applications, and of the aforesaid patent, are hereby incorporated by reference herein.

FIELD OF THE INVENTION

The present invention relates to methods of making microelectronic assemblies, and to components for use in fabrication of microelectronic assemblies.

BACKGROUND OF THE INVENTION

Complex microelectronic devices such as modern semiconductor chips require numerous connections to other electronic components. For example, a complex microprocessor chip may require hundreds of connections to external devices.

Semiconductor chips typically have been connected to electrical conductors on mounting substrates such as circuit panels by methods such as wire bonding, tape automated bonding, and flip-chip bonding. In wire bonding, the chip is positioned on the substrate with the bottom or back surface of the chip abutting the substrate and with the contact-bearing front or top surface of the chip facing upwardly, away from the substrate. Individual fine wires are connected between the contacts on the chip and the contact pads of the substrate. In tape automated bonding, a flexible dielectric tape bearing a prefabricated array of leads is positioned over the chip and substrate, and the leads are bonded to the contacts of the chip and to pads of the substrate. In both wire bonding and conventional tape automated bonding, the pads on the substrate must be arranged outside of the area covered by the chip, so that the wires or leads spread out from the chip to the surrounding pads on the substrate.

In flip-chip bonding, the contact bearing or front surface of the chip faces towards the substrate. Each contact on the chip is joined by a solder bond to the corresponding pad on the substrate. The flip-chip technique yields a compact assembly, which occupies an area of the substrate no larger than the area of the chip itself. Such compactness reduces the overall size of the circuit. Because the speed with which an electronic digital circuit can operate is inversely related to the lengths of the conductors connecting the various elements of the circuit, saving space also helps the circuit operate faster. However, flip-chip assemblies suffer from significant problems with thermal stress. The bonds between the chip contacts and the substrate are substantially rigid. Changes in the size of the chip and of the substrate due to thermal expansion and contraction in service create substantial stresses in the bonds, which in turn can lead to fatigue failure of the bonds. Moreover, it is difficult to test the chip before attaching it to the substrate.

As described in commonly assigned U.S. Pat. Nos. 5,148,265 and 5,148,266, a chip package may include a flexible sheetlike structure referred to as a "interposer" or "chip carrier" having terminals disposed on a flexible sheetlike structure. The interposer may be disposed on the front or contact bearing surface of the chip so that the terminals face away from the chip. The terminals are connected to contacts on the chip by flexible leads. Preferably, a compliant layer is disposed between the terminals and the chip. In certain preferred embodiments, the packaged chip occupies the same area, or only a slightly larger area than the chip itself. The packaged chip can be readily tested and can be mounted to a substrate by bonding the terminals of the chip carrier to the contact pads of the substrate. In use, the terminals on the chip carrier are free to move relative to the chip. This allows the assembly to compensate for differential thermal expansion and warpage of the chip or substrate without imposing significant stresses on the bonds.

As taught in certain preferred embodiments of U.S. Pat. No. 5,518,964, commonly assigned, microelectronic assemblies incorporating flexible leads can be fabricated using a first element or connection component including a dielectric structure having leads on a bottom surface. Each such lead has a fixed end permanently attached to the dielectric structure and, typically, connected to one or more terminals on the top surface of the dielectric structure. Each such lead also has a free or tip end remote from the fixed or terminal end. Preferably, the free or tip ends of the leads are releasably attached to the dielectric structure. This element can be juxtaposed with a second microelectronic element such as a semiconductor chip or wafer, and the free ends of the leads may be bonded to contacts on such second microelectronic element. After bonding, the elements are moved vertically away from one another through a predetermined displacement, thereby detaching the free or tip ends of the leads from the bottom surface of the dielectric component and deforming the leads to a vertically extensive configuration. Preferably, a curable encapsulant is introduced between the elements and around the leads during or after the moving step, so as to provide a compliant layer between the dielectric layer and the second microelectronic element. This arrangement allows fabrication of compliant chip assemblies having advantages similar to those discussed above with respect to the '265 and '266 patents using a process which permits simultaneous connection and forming of numerous leads. In certain preferred embodiments according to the '964 patent, one of the microelectronic assemblies may include numerous semiconductor chips. For example, one of the microelectronic elements may be a wafer incorporating numerous chips, and leads on all of the chips may be connected and formed in the same operations. After these operations, the resulting large assembly can be severed to form individual units each including one or more of the chips originally present in the wafer, together with a portion of the dielectric element and the terminals thereon.

In those embodiments of the '964 invention which use a preformed connection component with leads thereon, and which register the connection component with a wafer or other microelectronic device, the spacing between the leads on the component desirably is controlled precisely. This allows registration of the free ends of the leads with contacts on a wafer or other microelectronic device. For example, certain preferred embodiments disclosed in the '964 patent use a temporary reinforcing layer overlying the dielectric layer, and also use a rigid, ring-like frame to maintain the dielectric layer and the reinforcing layer to maintain the dielectric layer in tension. These features help to control thermal expansion and contraction of the connection component during the processes used to bond the free ends of the leads to the wafer or other microelectronic component, and help to maintain the desired spacing between the lead free ends.

The aforementioned U.S. patent application Ser. No. 08/366,236 (the "'236 application") discloses still other improvements in microelectronic device fabrication. Thus, certain embodiments of the '236 application form terminals on a microelectronic connection component by etching a solid sheet of copper or another electrically conductive metal. As set forth in greater detail in the '236 application, spots of an etch resistant material such as a photoresist or a metal may be deposited on an exposed surface of the sheet, and the sheet may be exposed to an etchant by dipping or by spraying so that the etchant erodes the sheet in areas other than those covered by the spots. The resulting terminals can be in the form of posts having a unique "cooling tower" shape having a wide base, a narrow neck portion and broader tip. These terminals are particularly well suited for engagement in small hollow sockets.

Despite these and other advances in the art of making microelectronic assemblies, still further improvements would be desirable.

SUMMARY OF THE INVENTION

One aspect of the present invention provides methods of making microelectronic assemblies. A method in accordance with this aspect of the invention includes the step of providing a first element including an electrically conductive layer such as a metallic sheet extending in horizontal directions, providing a second element and providing a plurality of flexible leads extending between the elements. Most preferably, at least some of the leads are electrically connected to the conductive layer and to the second element. The elements are then moved relative to one another with a component of motion in a vertical direction so as to move the elements away from one another and deform the flexible leads to a vertically extensive disposition. A compliant layer, most preferably a dielectric compliant layer, is provided between the elements, as by injecting a curable liquid around the flexible leads either during or after the moving step, and curing the liquid. Portions of the metallic sheet are removed so as to leave residual portions of the metallic sheet. The residual portions form one or more electrically conductive parts of the assembly. Most preferably, the residual portions of the conductive layer form terminals electrically connected to at least some of the flexible leads. The terminals preferably are movable relative to the second element and relative to one another.

Typically, the flexible leads are provided in a prefabricated assembly on the first element. Each lead desirably has a fixed end which is permanently attached to the first element and electrically connected to the conductive layer and a free end releasably secured to the first element. The first element, with the leads thereon, is then juxtaposed with the second element and the free ends of the leads are bonded to the second element prior to the moving step. During the moving step, the free ends of the leads are detached from the first element. The first element may include a dielectric layer having top and bottom surfaces. The conductive layer may be disposed over the top surface of the dielectric layer and the leads may extend along the bottom surface of such layer.

The fixed ends of the leads may be connected by through vias or other electrical connectors extending through the dielectric layer. The through via liners may also serve to mechanically anchor the fixed ends of the leads. The step of removing portions of the conductive layer may be performed so as to form the terminals to include a plurality of elongated posts extending generally vertically, or to form terminals of other configurations. The removing step may be performed by etching the sheet, desirably after depositing spots of an etch resistant material on the top surface of the sheet. Alternatively, the conductive layer may include masses of a first material such as gold in a sheet of a second material such as copper, and the etching step may be performed with an etchant which removes the second material but does not substantially remove the first material, so that the masses of first material are left as the terminals.

In preferred methods according to this aspect of the present invention, the conductive layer performs several functions. The conductive layer serves as a structural member of the first element. Thus, the first element as a whole has the rigidity and the well-controlled, predictable thermal expansion properties associated with metals. This simplifies registration and connection of the leads. The same conductive layer also forms the terminals or other conductive parts in the finished product. Moreover, by removing portions of the conductive layer, and preferably subdividing the conductive layer into individual terminals, the process restores the flexibility of the assembly. Thus, the individual terminals are free to move relative to one another and relative to the second microelectronic element. This flexibility and free movability are restored after the connections have been made between the lead tips and the wafer or other microelectronic element and hence after the steps which require careful control of interlead spacing over a large area have already been performed. Stated another way, during the initial alignment steps, when the first element with the leads thereon is aligned with the wafer or other microelectronic device, the first element performs like a rigid body and provides precise control of lead position. After removal of parts of the conductive layer such as to subdivide the sheet and form the terminals, the assembly provides the benefits associated with a flexible, compliant device.

In a variant, the dielectric layer included in the structure can be omitted. For example, the first element may include only the metallic, conductive layer, with the leads positioned on the bottom surface of the metallic sheet. After the free ends of the leads have been bonded to the wafer or other microelectronic element, and after the moving step has detached the free ends of the leads from the metallic sheet and bent the leads to the vertical configuration, a compliant material is introduced between the metallic sheet and the wafer or other microelectronic element. The compliant material is cured to form a compliant layer, and the metallic sheet is then etched or otherwise converted to a plurality of individual terminals. This leaves individual terminals supported directly by the compliant layer and free to move relative to one another and relative to the wafer or other microelectronic element.

A further aspect of the present invention provides a component for use in fabrication of microelectronic assemblies. Preferred components according to this aspect of the invention include a structure having top and bottom surfaces extending in horizontal direction. The structure includes an electrically conductive, preferably metallic sheet having top and bottom surfaces extending in the horizontal directions. The component further includes a plurality of flexible leads extending along the bottom surface of the structure. Each lead has a fixed end attached to the structure and electrically connected to the conductive layer and also has a free end remote from the fixed end. The free ends of the leads are displaceable in vertical directions away from the structure. Preferably, the free ends of the leads are releasably attached to the bottom surface of the structure. The structure may include a dielectric layer overlying the bottom surface of the sheet and disposed between the leads and the sheet, as well as conductors extending through the sheet and connecting the sheet and the fixed ends of the leads. Alternatively, the sheet may define the bottom surface of the structure, i.e., the bottom surface of the structure may be the bottom surface of the conductive layer. In this case, the fixed end of each lead is permanently attached to the sheet, whereas the free or tip end of the lead is releasably attached to the metallic sheet. The free ends of the leads may incorporate bonding material arranged to bond the free ends to conductive terminals on microelectronic elements. The component may further include a rigid frame connected to the conductive layer and preferably maintaining the conductive layer in tension. Components in accordance with this aspect of the invention may be used in processes as discussed above.

These and other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 2 is a fragmentary, diagrammatic sectional view depicting portions of components used in the process of FIG. 1, during one stage of the process.

FIGS. 3, 4 and 5 are fragmentary, diagrammatic sectional views similar to FIG. 2, but depicting the components in progressively later stages of the same process.

FIGS. 16A through 16H are fragmentary, diagrammatic sectional views depicting stages in a process according to yet another embodiment of the invention.

DETAILED DESCRIPTION OF THE PREFERRED EMBODIMENTS

Figure 1:
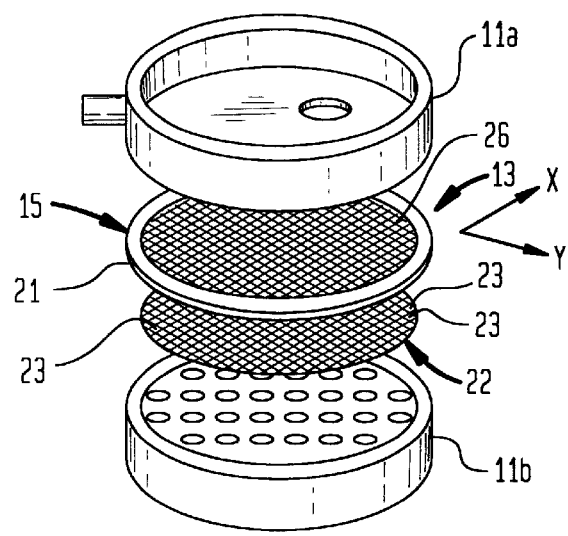
FIG. 1 is a diagrammatic exploded perspective view depicting components and equipment utilized in a process according to one embodiment of the invention.

A connection component 15 in accordance with one embodiment of the invention includes a structure 13 formed form a such as a dielectric sheet 10 having top and bottom surfaces and a metallic, electrically conductive reinforcing layer or sheet 26, also having top and bottom surfaces. Conductive layer 26 overlies the top surfaces of the dielectric sheet, so that the top surface of the conductive layer defines the top surfaces of the structure, whereas the dielectric sheet defines the bottom surface of the structure. Conductive layer 26 desirably is formed from a metal or metal alloy which is readily etchable using subtractive etching techniques. For example, a copper or copper alloy sheet such as phosphor bronze about 100 microns to about 500 microns thick or thicker may be employed. Dielectric sheet 10 may be formed from a polymer such as a polyimide, and typically is about 25 microns to about 75 or 100 microns thick.

Metallic leads 12 are provided on a first or bottom surface 14 of the structure. Each lead has a fixed or terminal end 16 permanently attached to structure 13 by metallic elements such as via liners 17 extending into structure 13, to the metallic conductive layer 26. Each lead also has a free or tip end 18 releasably attached to the bottom surface of structure 13 defined by the dielectric sheet by a small metallic button 19 projecting from the free end to the dielectric sheet and adhering to the dielectric layer over a small area. As further described in the '964 patent, leads in this configuration can be fabricated by plating an etch-resistant metal such as gold over a layer of a readily-etchable metal such as copper on the bottom surface 14 of the dielectric sheet, and then etching the resulting assembly so that the etchant removes the copper from beneath the lead. Each lead has a large-diameter bulge at its fixed end, a small-diameter bulge at its free end and an elongated narrow section extending between these bulges. The etching process is allowed to proceed until the copper has been removed between the narrow section and the dielectric sheet, leaving copper only in the via liners 17 and buttons 19 beneath the bulges. The free or tip ends 18 of the leads may be provided with bonding materials 29 suitable for bonding the tips to contacts on the wafer. For example, where the leads are formed from gold, eutectic bonding materials such as tin, germanium, silicon, tin or combinations thereof capable of forming low-melting eutectics with the gold in the leads, or alloys of these materials with gold, can be provided. Other bonding materials such as solders or electrically conductive polymers also can be used.

The first element further includes a rigid, ring-like frame 21 (FIG. 1) encircling structure 13. The frame is attached to metal layer 26 at the periphery of the layer. Frame 21 maintains metal layer 26 and dielectric layer 10 in tension. Preferably, the frame is arranged to maintain tension on the metal layer at all temperatures encountered during the process discussed below. For example, the frame may have a coefficient of thermal expansion lower than the coefficient of thermal expansion of metal layer 10, and the frame and metal layer may be assembled, as by brazing or otherwise bonding the metal layer to the frame, while the frame and metal layer are at a temperature higher than the temperatures which will be used in the process discussed below. Thus, a molybdenum frame or other frame having a coefficient of thermal expansion close to that of silicon may be used. The frame may be assembled to the metal sheet before or after the dielectric layer and leads are formed. Also, the frame may be attached to the dielectric layer rather than to the metal layer, provided that the frame maintains the dual-layer structure of the dielectric layer and metal layer in tension. Further techniques for using frames to maintain sheetlike structures in tension during processing are so as to achieve accurate alignment between features on the sheetlike structure and features on other elements are disclosed in the copending, commonly assigned United States Provisional Patent Application entitled "Framed Sheet Processing" filed on Oct. 17, 1997 in the names of Masud Beroz et al., the disclosure of which is incorporated by reference herein.

In a process according to one embodiment of the invention, structure 13, with leads 12 on its bottom surface, is engaged with a semiconductor wafer 22 incorporating a plurality of chips 23. For example, the first element including structure 13, with ring 15 thereon and the second element or wafer 22, may be engaged between a pair of platens 11 and forcibly engaged with one another by urging the platens toward one another while the elements are maintained at elevated temperature. Prior to such engagement, the elements are brought into alignment with one another so that the free or tip end of each lead is in alignment with the appropriate contact 24 on the top surface 27 of the wafer. Thus, the elements may be registered with one another by registering fiducial marks (not shown) on the structure 13 or ring 15 with fiducial marks on wafer 22, using a conventional robot vision system to detect the locations of the fiducial marks. The fiducial marks on each element are provided in precise registration with the other features on the same element, as by forming the fiducial marks in the same process as used to form the other features, or by forming the other features in a process using equipment registered to the fiducial marks. One or both elements may be moved in horizontal directions and rotated about a vertical axis to bring the elements into the correct registration with one another.

This precise alignment can be achieved even over a relatively large element, covering an entire wafer. For example, wafer 22 and structure 13 may be about 10–30 cm in diameter. Even over this large area, however, the tip ends of the leads may be aligned with the contacts with good precision. Several factors contribute to such precise alignment. Because structure 13 is held taut throughout the lead forming process and the aligning process by the same frame 32, the leads remain in position. Also, the free or tip ends 18 of the leads are secured to the bottom surface of structure 13 by buttons 19 at all times from the time the leads are formed up to and including the alignment process. Therefore, these ends cannot move relative to structure 13. Moreover, because frame 15 has a coefficient of thermal expansion close to that of the wafer, variations in temperature during the alignment process, and during subsequent steps discussed below, will not tend to move the structure relative to the wafer. Because the frame maintains the structure in tension, thermal expansion and contraction of the structure will be substantially reflected in changes in the degree of tension in the metallic sheet, rather than in changes in size. Moreover, metallic sheet 26 controls deformation of structure 13. Because the metallic sheet is substantially stiffer than dielectric sheet 10, thermal expansion and contraction of the entire structure will be essentially the same as the thermal expansion and contraction of the metallic sheet alone. The structure has substantially uniform expansion and contraction properties over its entire area.

The tip ends 18 of the leads are bonded to contacts 24 on the surface of the wafer under the influence of the heat and pressure applied by platens 11. A gas may be introduced under pressure between the top platen 11a (FIG. 1) and structure 13.

After bonding, the first element including structure 13 and the second element or wafer 22 may be moved through a preselected displacement relative to one another with a component of motion in a vertical direction, so that the first and second elements move away from one another. In this process, the leads 12 are bent to a vertically extensive configuration depicted in FIG. 3. The moving step may be accomplished by moving platens 11 (FIG. 1) away from one another while maintaining the elements in engagement with the platens, as by applying a vacuum through holes in the platens. Alternatively or additionally, a fluid may be introduced under pressure between the elements so as to force the elements away from one another. A flowable liquid material may be injected between the bottom surface 14 of structure 13 defined by dielectric sheet 10 and the top surface 27 of the wafer or microelectronic element 22 concomitantly with the moving step or after the moving step, and this liquid may be cured to form a compliant layer such as an elastomer or gel layer 28 therebetween. The flowable liquid may be applied under pressure to force the elements away from one another.

Before or after formation of the compliant layer, etch resistant spots 30 are applied on the top surface of the metallic conductive layer 26 remote from dielectric layer 10. The spots are applied in registration with via liners 17. For example, a photographic spot-forming process may be registered to structure 13 using the same fiducial marks discussed above. Spots 30 may be formed from photoresist or, as shown, from an etch resistant metal such as gold, platinum, or the like. Following application of spots 30, the assembly is exposed to an etchant such as an HCl and CuCl etch solution. Compliant layer 26 and the dielectric structure 10 serve to protect microelectronic element 22 and leads 12 from the etchant during the subdividing step.

Figure 6A:
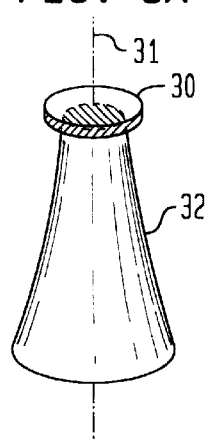
FIGS. 6A–6C are diagrammatic perspective views of terminals in accordance with embodiments of the invention.
Figure 6B:
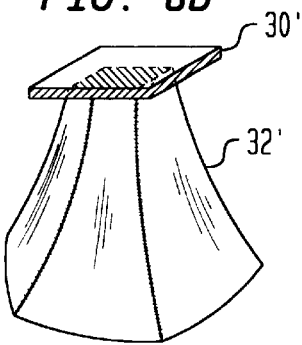
Figure 6C:
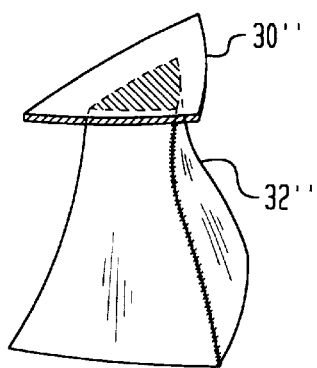

The etchant may be applied by immersing the assembly in the etchant or by spraying the etchant against the top surface of metallic sheet 26. The etchant removes the metal of layer 26 except in the areas beneath spots 30, thereby forming subdividing the metallic sheet and forming individual terminals 32 connected to leads 12 by via liners 17. Desirably, the etchant is sprayed at a relatively high angle to the top surface, so that the etchant impinges on the top surface with a velocity vector directed almost perpendicularly to the top surface. This promotes formation of terminals 32 with the "cooling tower shape" depicted in FIG. 5. As used herein, the expression "cooling tower shape" refers to a body having relatively large cross-sectional dimensions at a base or bottom region adjacent dielectric layer 10, tapering inwardly to narrow cross-sectional dimensions at a neck region 34 and tapering outwardly again to larger cross-sectional dimensions at a tip remote from the base. As shown in FIGS. 6A–6C, the cross-sectional shapes of the terminals can be controlled by selection of the shape of spots 30. Thus, where spots 30 are circular, terminals 32 will be formed substantially as cooling tower shapes which are bodies of revolution about vertical axes 31, and hence will have circular cross-sectional shapes. Where the spots are polygonal, such as the square spots 30' of FIG. 6B or the triangular spots 30" of FIG. 6C, the terminals 32' and 32" will have cooling tower shapes of polygonal cross-section.

Figure 7A:
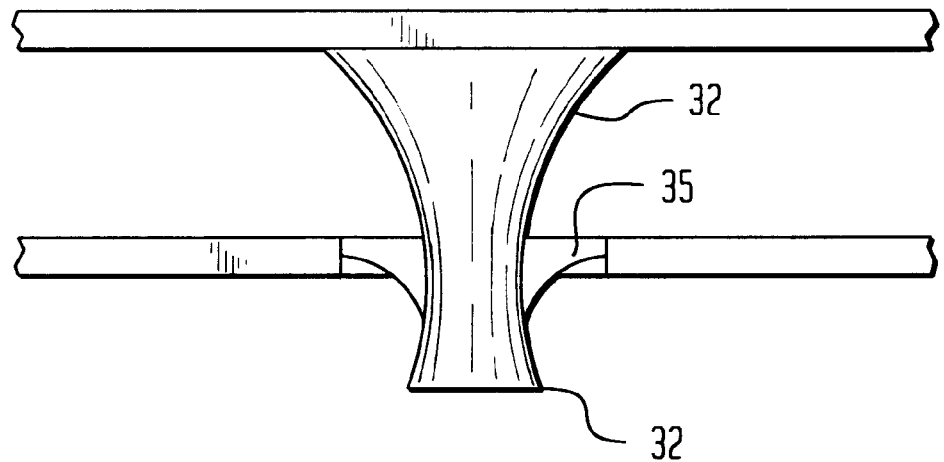
FIG. 7A is a diagrammatic sectional view of a terminal in engagement with a socket.
Figure 7B:
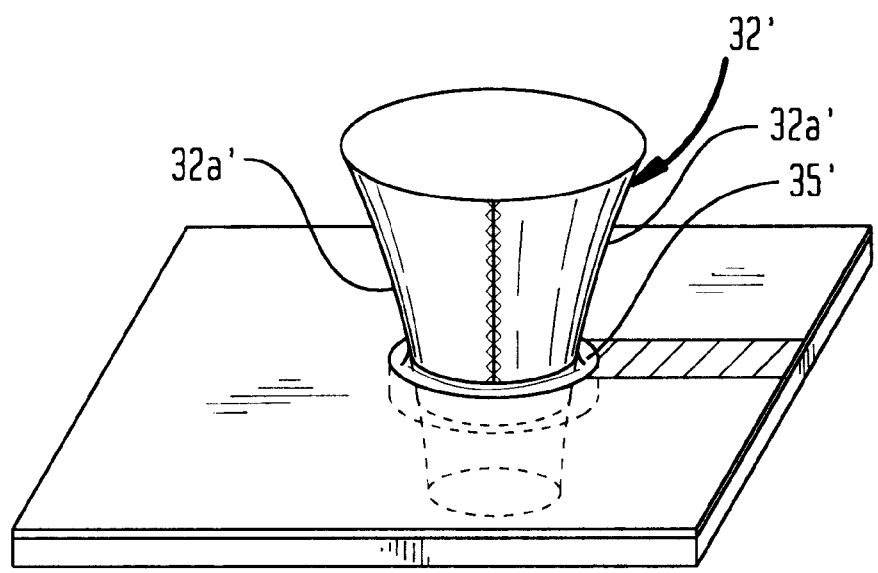
FIG. 7B is a diagrammatic perspective view of a further terminal and socket.

As further described in the '236 application, the cooling tower shapes are particularly desirable in that they can be securely received in small sockets. As depicted in FIG. 7A, the tip 32a of a cooling tower shape terminal 32 will resist disengagement from a resilient socket 35. As best seen in FIG. 7B, the vertical edges 32a' of a cooling tower shape terminal 32' with a polygonal cross-section will provide a high-force wiping contact when engaged with a round socket 35', which tends to provide a low-resistance, reliable electrical connection. However, the terminals can be formed with shapes other than the cooling tower shapes discussed above.

The terminals associated with the entire microelectronic element can be received in a single large fixture with many sockets. In a particularly useful example, where the microelectronic element is a wafer incorporating numerous chips, the entire wafer can be tested by engaging the assembly with a fixture so as to engage all of the terminals with sockets on the fixture simultaneously, and thereby connect all of the chips to the test fixture. After testing, the assembly can be disengaged from the fixture. Packaged units each including a single chip with associated portions of the dielectric structure, compliant layer and associated terminals can be obtained by severing the wafer, dielectric structure and compliant layer along scribe lines of the wafer, i.e., along the lines of demarcation between individual chips 23.

Moreover, in the wafer-size assembly, and in the individual units, the terminals are movable relative to one another and relative to the microelectronic element. Thus, because the major portion of the metallic sheet has been removed leaving individual, separate terminals, the metallic sheet does not impede flexure of the flexible dielectric sheet 10. Also, the flexible leads do not impede movement of the dielectric sheet and terminals. The compliant layer 28 further mechanically decouples dielectric sheet 10 and terminals 32 from the microelectronic element 22. Such movability allows compensation for effects such as thermal expansion and contraction during use.

Figure 8:
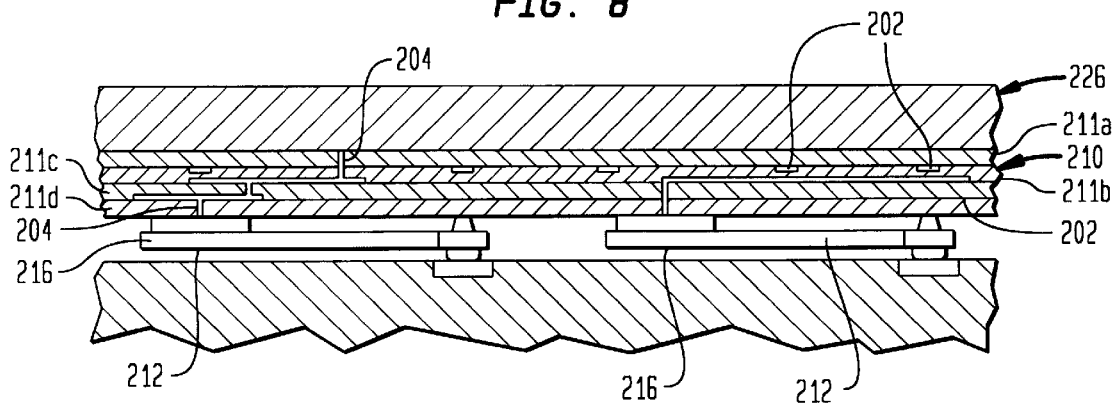
FIGS. 8 and 9 are views similar to FIGS. 3–5 but depicting components in accordance with a further embodiment of the invention.

Numerous variations and combinations of the features discussed above can be utilized. For example, the fixed or terminal ends of the leads need not be connected to the reinforcing layer 26 by straight via liners 17 as discussed above, which provide mechanical coupling. For example, the dielectric layer 210 depicted in FIG. 8 is composed of several sub-layers 211a–211d of dielectric material and includes several layers of internal traces 202 extending at the interfaces between the sub-layers in horizontal directions parallel to the top and bottom surfaces of the dielectric layer, and vertical conductors 204 interconnecting some of these traces. Layer 210 can be formed by laminating several layers with prefabricated traces and through conductors to one another. The fixed ends 216 of leads 212 are electrically connected to certain vertical conductors and traces within layer 210. The metallic conductive layer 226 overlies the top surface of layer 210, defined by the topmost sub-layer 211a. Some of the vertical conductors and traces in turn are electrically connected to the metallic conductive layer 226, thus indirectly connecting at least some of the fixed ends to the metallic sheet. However, the fixed ends of the leads are not mechanically connected to the conductive layer by the vertical conductors. Rather, the fixed ends of the leads are secured on the bottom surface of layer 210 by a strong metal-to-polymer bond, whereas the free ends of the leads are only weakly attached to the bottom surface of layer 210.

Methods of controlling metal to polymer adhesion are described in copending, commonly assigned U.S. patent application Ser. No. 08/690,532 filed Jul. 31, 1996, the disclosure of which is hereby incorporated by reference herein.

Figure 9:
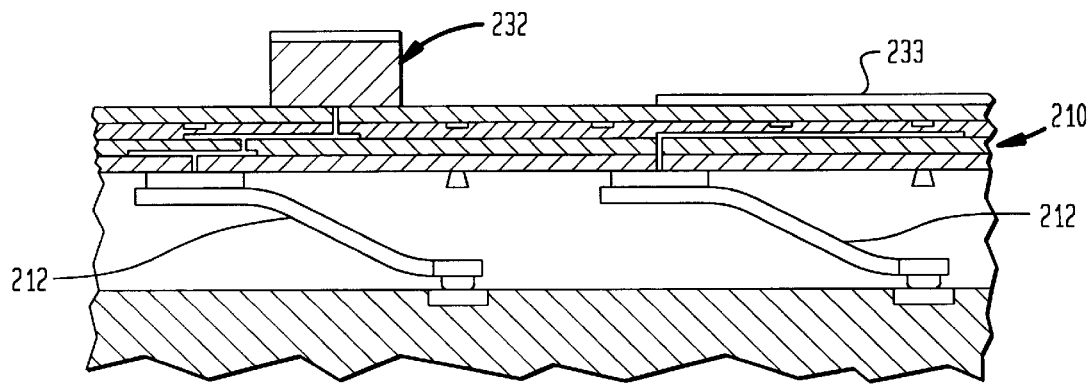

In this arrangement as well, portions of metallic sheet 226 are removed, as by etching, to leave terminals 232 (FIG. 9) on the top surface of layer 210. The other process steps may be substantially as described above. However, in the embodiment of FIGS. 8–9, there is no direct, one-to-one correspondence between the terminals 232 and the fixed ends of leads 212. Thus, some or all of the fixed ends 216 may be connected through horizontally extending traces within dielectric layer 210. The terminals 232 may be formed at locations other than directly above the fixed ends of the leads. The terminals 232 may be more numerous or less numerous than the leads 212. Also, the subdivided metallic reinforcing layer may form structures other than terminals as, for example, conductors 233 extending along the top surface of the dielectric element. As further discussed below, the metallic reinforcing layer can be etched or otherwise treated to form aground plane or other potential plane.

Figure 10:
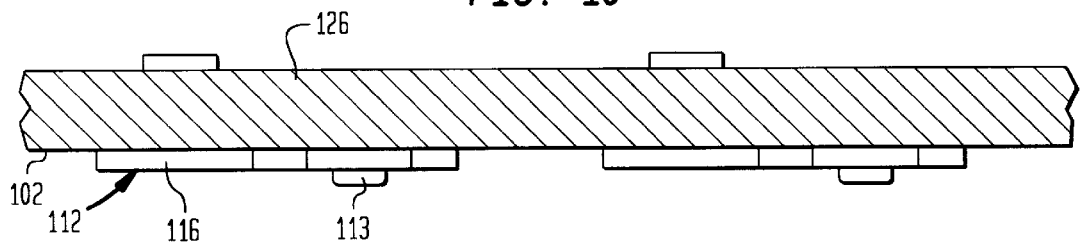
FIG. 10 is a fragmentary, diagrammatic sectional view depicting a component in accordance with a further embodiment of the invention.
Figure 11:
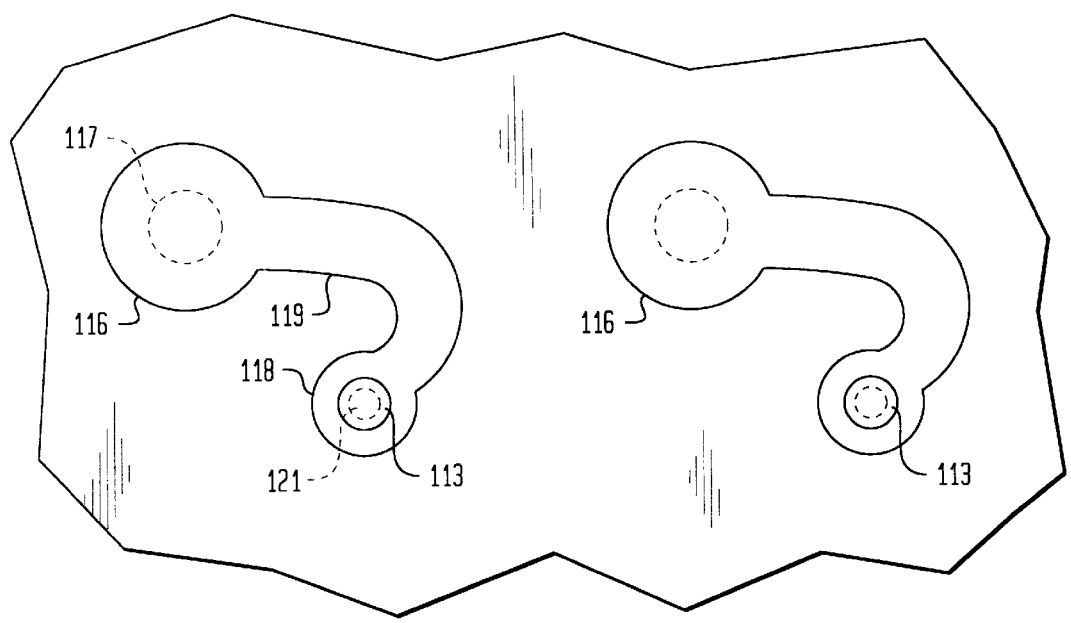
FIG. 11 is a fragmentary, bottom plan view of the components shown in FIG. 10.
Figure 12:
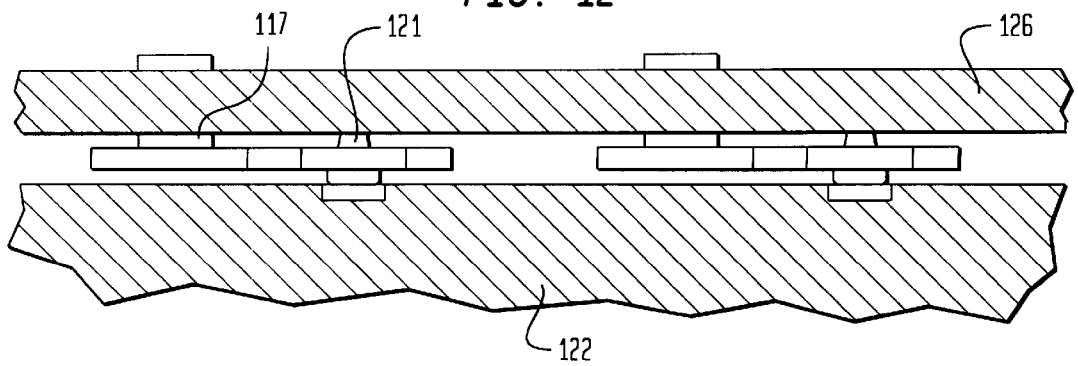
FIG. 12 is a fragmentary, diagrammatic sectional view depicting the component of FIGS. 10 and 11, together with a further component during a process according to a further embodiment of the invention.
Figure 13:
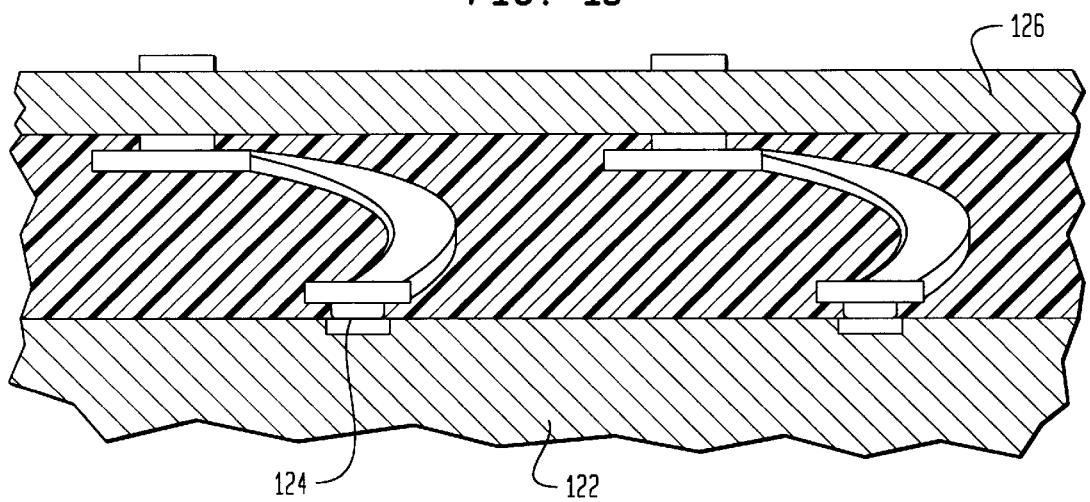
FIGS. 13 and 14 are views similar to FIG. 8, but depicting the components of FIG. 12 during progressively later stages of the process.
Figure 14:
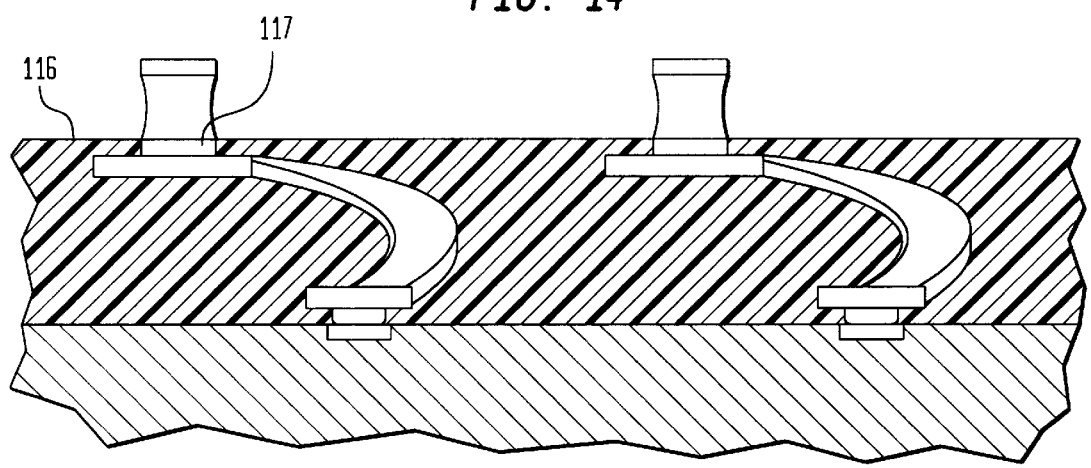

In a further variant, illustrated in FIGS. 10–14, the dielectric layer is omitted. Thus, leads 112 are formed by plating or otherwise depositing gold or another etch-resistant metal directly on the bottom surface 102 of a conductive layer 126. Conductive layer 126 is formed from a copper-based or other etchable metal. Etch resistant spots 130 are formed on the top surface of metal layer 126. Each lead has a bonding material 113 such as a gold-tin alloy at the tip end 118 of the lead. As best seen in FIG. 10, each lead has a relatively large end portion at its fixed or terminal end 116, a somewhat smaller end portion at its free or tip end 118, and a narrow elongated portion 119 extending between these end portions. The width of elongated portion 119 is less than the diameter of either end portion.

In the next stage of the process, the bottom surface 102 of metal layer 126 is exposed to an etchant for a limited time, while the top surface is protected from the etchant. The etchant removes the metal of layer 126 around each lead 112, and etches progressively beneath each lead starting from the edges of the lead. The etching process is continued until the metal of layer 126 has been removed from beneath elongated portion 119. At this time, the etching process is stopped. At this time, the metal of layer 126 has not been entirely removed from beneath the end portions of each lead. Thus, the terminal end of each lead remains connected to layer 126 by a relatively large, strong metallic stem 117, whereas the tip end 118 of each lead remains connected to layer 126 by a small, weak stem 121.

The metal layer with the leads thereon is then juxtaposed with the microelectronic element 122 and the tip ends of the leads are bonded to the contacts 124, in the same manner as discussed above (FIG. 12). Next, the metal layer 126 is moved upwardly, away from the microelectronic element, and a liquid material is injected between layer 126 and microelectronic element 122 to form a compliant layer 128. In these stages of the process, the metal layer acts as the first element in the process of deforming the leads as discussed above, whereas the microelectronic element acts as the second element.

After formation of the compliant layer, the metal layer 126 is etched from its top surface in the same manner as described above, to form terminals 132 beneath the etch-resistant spots 130. Each such terminal remains connected to the fixed or terminal end 116 of a lead 112 by the stem 117 formed earlier in the process. The resulting assembly can be used in substantially the same manner as the assemblies described above. Here again, the individual terminals are movable relative to one another and relative to the microelectronic element.

The process can be used with individual semiconductor chips or other individual microelectronic devices, rather than with a wafer as discussed above. In this case, there is no need to sever the dielectric layer. The order of steps may be varied. Thus, the step of removing portions of the conductive layer so as to subdivide the conductive layer and form terminals may be performed before the step of moving the elements and deforming the leads. The conductive layer may be formed from electrically conductive materials other than metals, such as conductive polymer compositions. Portions of the conductive layer may be removed by processes other than etching as, for example, laser ablation or mechanical processes. The material used to form reinforcing layer 26 and hence used to form terminals 32 can be selected to have a coefficient of thermal expansion close to that of the microelectronic element. In yet another alternative, the tip ends of the leads or the contacts on the chips can be provided with a bonding alloy or conductive adhesive that can be activated at a low temperature. Also, the techniques discussed above can be used to form assemblies according to the teachings of copending, commonly assigned U.S. patent application Ser. Nos. 08/532,528 filed Sep. 22, 1995 and 08/678,808 Filed Jul. 12, 1996 the disclosures of which are also incorporated by reference herein. Moreover, the techniques discussed above can be utilized in conjunction with the teachings of copending, commonly assigned United States Provisional Patent Applications 60/045,690, filed May 6, 1997 and 60/033,066, filed Dec. 12, 1996, of Thomas H. DiStefano and the teachings of the copending, commonly assigned United States Patent Application of Thomas H. DiStefano entitled MICROELECTRONIC MOUNTING WITH MULTIPLE LEAD DEFORMATION USING RESTRAINING STRAPS, filed of even date herewith and claiming benefit of such provisional patent applications. The disclosures of the applications referred to in this paragraph are incorporated by reference herein. As taught in such applications, the relative motion of a elements used to deform leads can be controlled by providing restraining straps extending between the elements. The restraining straps typically are stronger than the leads and shorter than the leads. The restraining straps limit and constrain the relative motion of the elements so that the leads are not pulled taut. Where this technique is used in the present invention, the restraining straps can be mechanically connected to the conductive layer. Moreover, the conductive layer desirably reinforces the structure and maintains it planar. Therefore, if a fluid is introduced to force the elements away from one another, the structure will remain planar even if no external constraining element is applied.

A fluid under pressure may be provided between the elements by use of a foamable material, as taught in commonly assigned United States Provisional Patent Application 60/032,870 filed Dec. 13, 1996, the disclosure of which is also incorporated by reference herein.

The frame discussed above can be varied. For example, the frame need not be circular, but instead can be rectangular or have any other shape. Also, the frame need not form a closed loop entirely encircling the structure formed by the dielectric sheet and the conductive reinforcing layer. Thus, the frame may have two or more discrete elements attached to the structure at spaced apart locations so that the frame holds the structure in tension. The frame can be formed in various ways, as by etching a solid sheet of a rigid material or machining the sheet to form an opening. In a process according to a further alternative, the frame is omitted entirely. Thus, the electrically conductive layer alone is sufficient to maintain dimensional stability of the structure and to maintain known, controllable spacings between the tip ends of the leads.

Figure 15A:
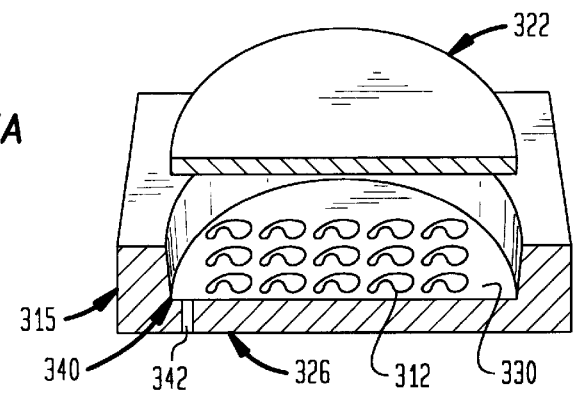
FIGS. 15A through 15E are diagrammatic, perspective, partially sectional views depicting a process according to yet another embodiment of the invention.

In a further variant, a frame 315 is formed integrally with a metallic reinforcing sheet or layer 326 (FIG. 15A). In combination, frame 315 and the structure including metallic layer 326 define a cup-shaped recess 340 which is open at a first end and which is closed at the other end by the structure or layer 326. Leads 312 are provided on the surface 330 of the structure or layer 326 which faces into the recess at the closed end. A dielectric layer (not shown) similar to the dielectric layer 10 of FIGS. 2–3 may also be provided at surface 330. The combination further includes a port 342 extending into recess 340 at or adjacent to the closed end or surface 330. As illustrated, port 342 extends through layer or structure 326 outside of the area occupied by leads 312. However, the port can also extend through frame 315.

Figure 15B:
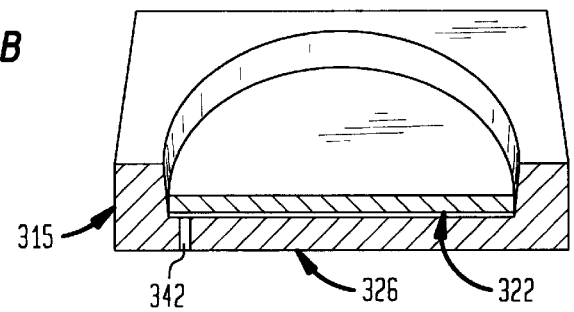
Figure 15C:
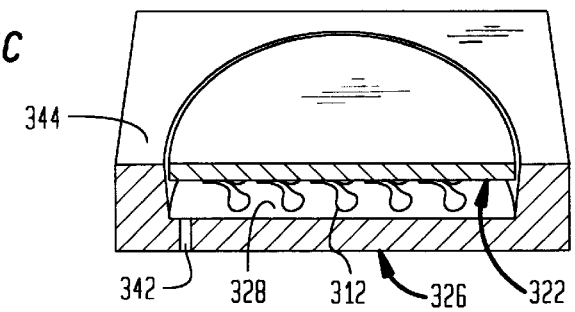
Figure 15D:
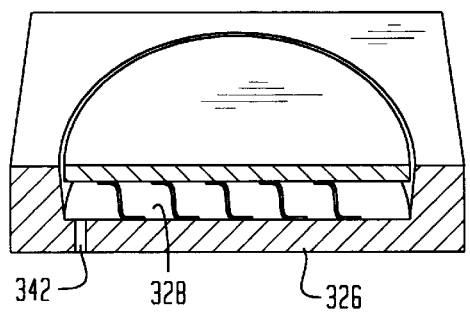
Figure 15E:
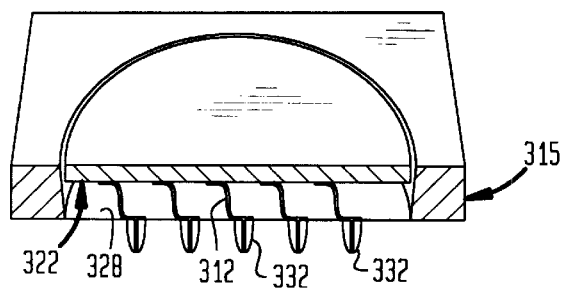
Figure 17A:
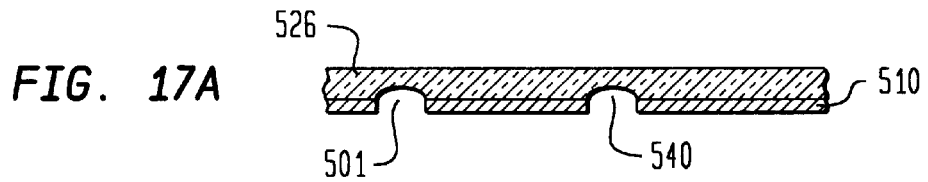
FIGS. 17A through 17F are views similar to FIGS. 16A–16H, but depicting a process according to a still further embodiment of the invention.
Figure 17B:
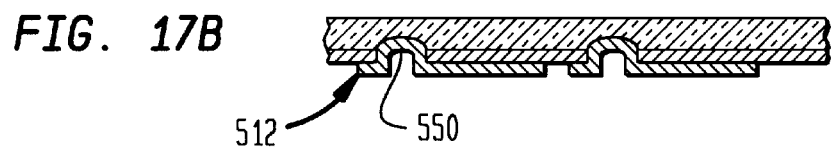
Figure 17C:
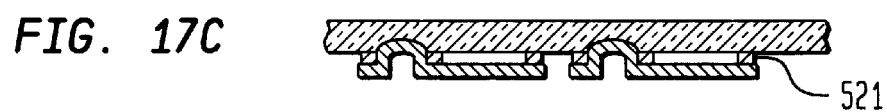
Figure 17D:
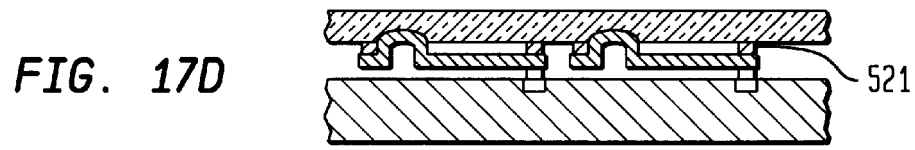
Figure 17E:
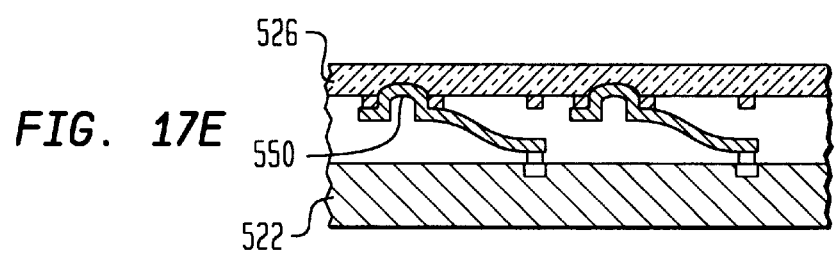
Figure 17F:
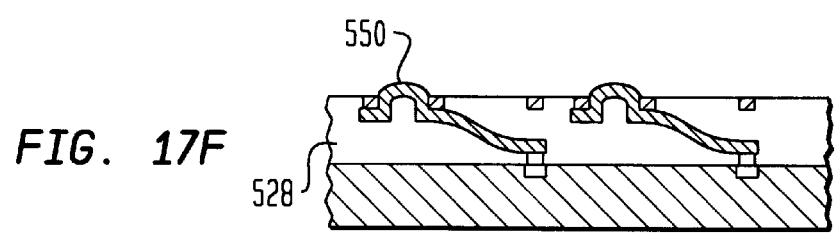

A wafer or other microelectronic element 322 is placed into recess 340 and contacts on a surface of the wafer are bonded to the free ends of leads 312 in the manner discussed above (FIG. 15B). A flexible seal such as a tape, diaphragm or gasket (not shown) is provided between the microelectronic element or wafer 322 and frame 315. In the next stage of the process, a fluid under pressure, preferably a curable liquid is introduced through port 342 so as to force the microelectronic element 322 and the structure including conductive layer 326 away from one another, thereby deforming leads 312 to a more vertically extensive disposition in the manner discussed above, and forcing the microelectronic element toward the open end of the recess. Here again, the degree of relative movement may be limited by external applied elements such as a plate resting on the surface 344 of frame 315, or by engaging frame 315 between a pair of flat plates. Alternatively, the degree of relative movement may be controlled by restraining straps as discussed above interspersed with leads 312 and connected between structure 326 and the microelectronic element. The curable material 328 is then cured to form a compliant layer (FIG. 15D). After formation of the compliant layer, the conductive layer 326 is partially removed, as by etching to subdivide the layer and form terminals 332. Other features such as leads or potential planes can be formed in lieu of or in addition to the terminals. As seen in FIG. 15E, the etching step used to subdivide sheet 326 may also remove part of frame 315.

At this stage, the assembly including the wafer or microelectronic element 322 and the terminals 332 connected thereto by flexible leads 312 can be stored and shipped. Part of frame 315 remains in place and helps to protect the relatively delicate wafer from physical damage. The frame may be removed by sawing it away from neighboring portions of the wafer in the same process used to subdivide the wafer and the dielectric element to form individual chip packages. Alternatively, the frame may be removed prior to processing, as by separately machining or etching the frame away. In a further variant, the assembly of the wafer 322, dielectric element terminals and leads can be pushed out of the frame. To allow removal in this manner, the dielectric material should not adhere strongly to the surfaces of the frame forming the walls of recess 340. To prevent such adhesion, the wall surfaces may be coated with a release agent such as a fluropolymer. In the process of FIGS.

15A–15E, the frame serves as a disposable fixture for use in the process of injecting the curable liquid. This avoids the problems associated with cleaning and reusing fixtures. The same process can be employed where the conductive layer and the frame are not formed integrally with one another, but are attached to one another.

In a process according to yet another variant, a structure 413 is formed by applying a temporary layer 410 on the bottom surface of a metallic conductive layer 426 (FIGS. 16A–16B). Layer 410 may be formed from a material which can be etched or dissolved and which has only limited adhesion to the surface of layer 426. Polymeric materials such as polyimide can be employed. Other polymers which can survive at the temperatures used in the bonding operation used to connect the leads to the microelectronic element may also be employed. Apertures 440 are formed in layer 410. These apertures may be formed by selectively applying the temporary layer, by laser ablating the temporary layer or by selectively etching the temporary layer. Metallic leads 412 (FIG. 16D) are then deposited on the surface of temporary layer 410, so that a fixed or terminal end 416 of each lead is connected to sheet 426 by a stem 417 integral with the lead and extending through one of the apertures 440 in layer 410. Leads 412 have a configuration similar to that discussed above with reference to FIGS. 10 and 11. Thus, each lead includes a narrow elongated section 419 extending from the fixed or terminal end 416 to the free or tip end 418 of the lead and a relatively wide, bulging section at the free or tip end.

In the next stage of the process, the structure is exposed to a solvent or etchant which attacks the material of temporary layer 410 but which does not substantially attack the material of leads 412 or conductive layer 426. For example, where temporary layer 410 is formed from polyimide, the structure may be exposed to a plasma which attacks the polyimide. Where layer 410 is composed from a soluble polymer, the structure may be exposed to a liquid solvent which dissolves away the polymer. The relatively broad tip ends of the leads protect the underlying material of temporary layer 410, so that small buttons of the polymer or other material in the temporary layer remain when the portions of layer 410 beneath the elongated sections 419 of the leads are entirely removed. At this stage, some portions of the temporary layer 410 may also remain beneath the lead at the terminal or fixed end 416. Buttons 421 releasably hold the tip or free ends 418 of the leads to conductive layer 426. In the next stage of the process, the tip ends are bonded to contacts on the wafer or microelectronic element 422 using bonding material 424 which may be carried either on the free ends of the leads or on the contacts of the microelectronic element.

Next, structure 413, now consisting essentially of the conductive layer 426, is moved away from the microelectronic element 422 so as to deform the leads as discussed above. Once again, the conductive layer is etched or otherwise subdivided to form terminals 432. The small polymeric buttons 421 provide limited adhesion between the tip ends of the leads and the conductive layer and thus permit easy release of the leads from the conductive layer during the process. However, the buttons 421 provide adequate adhesion to hold the free ends of the leads in position prior to bonding with the microelectronic element.

The process of FIGS. 17A–17F is identical to the process of FIGS. 16A–16H except that in the process of FIGS. 17A–17F, cavities 501 are formed in a sheet which forms part of the conductive layer 526. The cavities are provided in alignment with the openings 540 of the temporary layer 510 before application of metal to form leads 512. Cavities 501 may be formed by etching the sheet before application of layer 510 or by etching the sheet after application of the temporary layer, using layer 510 as a mask. When the lead-forming metal is applied, is substantially fills cavities 501 and forms generally dome-shaped bumps or masses 550 extending within conductive layer 526 and forming parts of the conductive layer. Preferably, the lead-forming metal has a greater resistance to etching than the metal constituting the remainder of layer 526. For example, where layer 526 is formed from copper, the leads and hence masses 550 may be formed from gold. Thus, the conductive layer in this embodiment includes masses of a first metal such as gold spaced apart from one another within a sheet of a second metal such as copper.

The process of etching or dissolving the temporary layer to form buttons 521, bonding the free ends 518 of the leads to the microelectronic element and moving the structure including conductive layer 526 away from the microelectronic element 522 proceeds in the same manner as discussed above. After introduction of a compliant dielectric material, and curing of the same to form a compliant layer 528, conductive layer 526 is exposed to an etchant without preliminary masking or depositing spots on the top surface of the layer. The etchant removes all of the second material in layer 526 other than the material of masses 550, leaving the masses as isolated terminals. Thus, in a process according to this embodiment, the material of the masses acts as etch resistant portions of the conductive layer. Differential etching is achieved by differing etch resistances in the material of the layer, rather than by masking the layer. Similar techniques, providing especially etch resistant material in masses of the conductive layer, can be used to form other elements as, for example, leads extending along the surface of the dielectric layer 528. The same techniques can be combined with use of a permanent dielectric layer underlying the conductive layer, similar to layer 10 discussed above with reference to FIGS. 1–5, or with a multilayer dielectric layer as discussed above with reference to FIGS. 8 and 9. Also, the especially etch resistant material can be provided in configuration other than the dome-shaped masses, and need not be formed from the same material as the lead. In a further variant, the second or less etch-resistant material included in conductive layer 526 need not be conductive.

Figure 18:
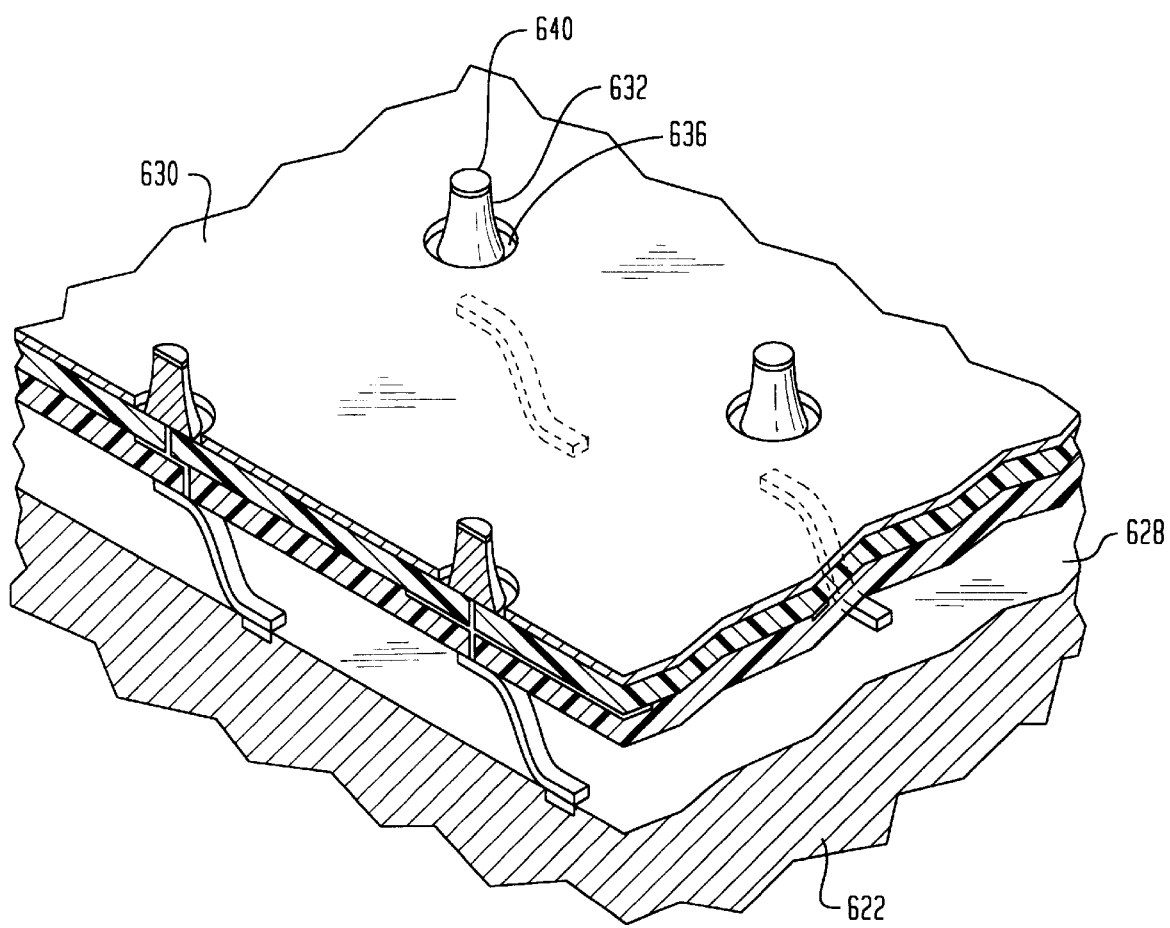
FIG. 18 is a fragmentary, perspective view depicting an assembly formed according to a process in accordance with a still further embodiment.

In a further variant, the step of etching or otherwise partially removing the conductive layer may be performed so as to provide portions of the conductive layer having different thicknesses. As shown in FIG. 18, the conductive layer may be removed by etching most of the surface deeply, so as to leave only a thin, flexible potential plane layer 630. Other portions of the surface are protected by etch resistant materials 640 and hence are not etched and remain as terminals 632. These terminals have a height substantially equal to the thickness of the original layer. Still other portions are etched entirely through the conductive layer, so as to form openings 636 in layer 630 surrounding each terminal 632 and thereby electrically isolating the terminals from the potential plane layer. For example, after the conductive layer has been etched to form layer 630, a photoimageable masking material may be applied on the surface of layer 630 and exposed to form apertures in the masking material corresponding to apertures 636. The etching process is then continued until the apertures 636 extend over layer 630. In still further variants, the conductive layer is etched to a reduced thickness of its entire surface and left as a continuous but flexible sheet. Stated another way, the conductive layer is not subdivided. Rather, portions of the material constituting the conductive layer are removed so that the remaining layer does not impair flexibility of the adjacent flexible or compliant layers. Thus, the stiff, reinforcing conductive layer is converted to a flexible conductive element of the finished device or to a plurality of individual, mutually movable conductive elements such as the individual terminals discussed above.

Figure 19A:
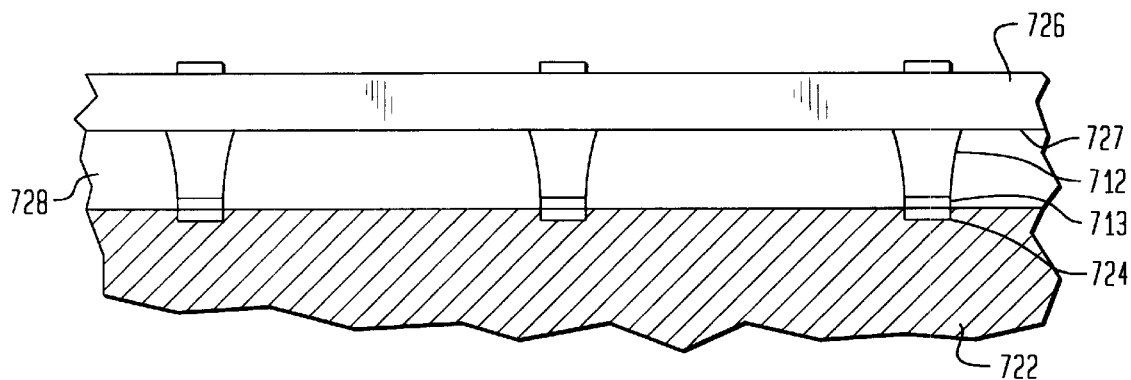
FIGS. 19A and 19B are fragmentary, diagrammatic sectional views depicting stages in a process according to yet another embodiment of the invention.
Figure 19B:
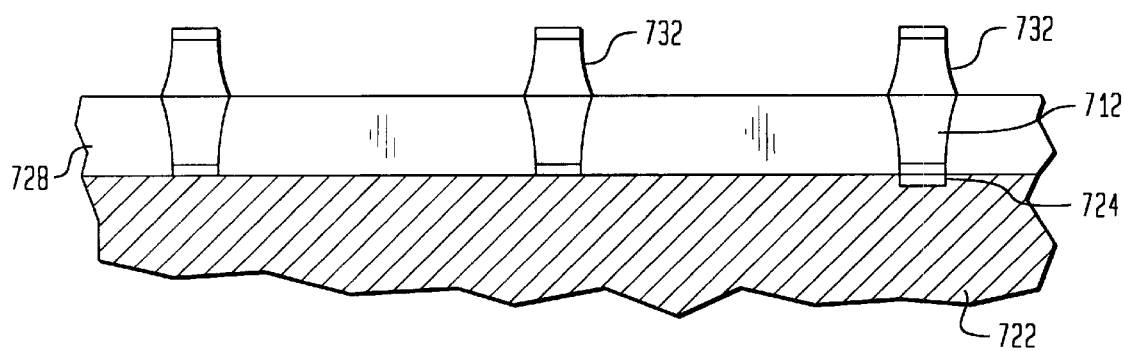

In a further variant of the invention, the conductive layer 726 is connected to the microelectronic element 722 by conductive attachment elements 712 which are not flexible and which are not deformed by relative movement of the structures in the manner discussed above. Rather, conductive attachment elements 712 may be substantially rigid posts applied to the conductive layer or formed by partial etching of conductive layer 726 at a bottom surface 727. The attachment elements may be provided with bonding materials at their tips 713 remote from layer 726. The structure including layer 726 and attachment elements 712 is juxtaposed with the wafer or other microelectronic element 722 as shown in FIG. 19A. In this embodiment as well, the rigidity of the conductive layer 726 contributes to the dimensional stability of the structure and allows accurate alignment of the attachment elements 712 with contacts 724 on the wafer or other microelectronic element. After bonding of the attachment element tips to the contacts, the structure including conductive layer 726 is spaced apart from the top surface of microelectronic element 722 by the attachment elements. A dielectric material such as a compliant material 728 is introduced between the structure 726 and the surface of the microelectronic element 722. Following formation of the dielectric layer, the conductive layer is again etched to form terminals 732 connected to conductive elements 712 and hence connected to wafer 722. Here again, etching or partial removal of the conductive sheet essentially eliminates rigidity of the sheet, leaving each terminal 732 and the associated conductive element 712 and chip contact 724 independent of the others. In this embodiment as well, the wafer can be severed to provide individual units, each including a portion of the wafer and the associated terminals. In a further variant (not shown), a flexible dielectric layer, similar to layer 10 discussed above is provided on the bottom surface 727 of the conductive layer and remains as a part of the finished assembly, overlying dielectric layer 728. As the conductive attachment elements 712 provided in this process are substantially less flexible than the flexible leads discussed above, processes according to this embodiment of the invention are more preferably utilize when individual connections will not be subjected to high thermal cycling strains as, for example, when the chips to be cut from the wafer are small and when the chips will be used with substrates which are well-matched to the chips in thermal expansion properties.

As these and other variations and combinations of the features discussed above can be employed, the foregoing description of the preferred embodiments should be taken by way of illustration rather than as limiting the invention as defined by the claims.

What is claimed is:

1. A method of making a microelectronic assembly comprising the steps of:
   (a) providing a first element including an electrically conductive layer extending in horizontal directions, a second element and a plurality of flexible leads extending between said elements; then
   (b) moving said elements relative to one another with a component of motion in a vertical direction so as to move said elements away from one another and deform said flexible leads to a vertically-extensive disposition;
   (c) providing a compliant layer between said elements; and
   (d) removing portions of said conductive layer and leaving residual portions of said conductive layer so that the residual portions of said conductive layer form one or more electrically conductive parts of the assembly.

2. A method as claimed in claim 1 wherein at least some of said leads are electrically connected to the conductive layer and at least some of said leads are electrically connected to said second element prior to said moving step, and wherein one or more of said electrically conductive parts formed in said removing step are electrically connected to one or more of said flexible leads.

3. A method as claimed in claim 2 wherein said one or more electrically conductive parts formed in said removing step include a plurality of terminals electrically connected to at least some of said flexible leads, said terminals being movable relative to said second element and relative to one another.

4. A method as claimed in claim 3 wherein said providing step includes the step of providing said conductive layer including a plurality of electrically conductive masses formed from a first material and a second material, at least some of said masses being connected to said leads, and wherein said removing step is performed so as to remove at least some of said second material and leave said masses.

5. A method as claimed in claim 4 wherein said removing step is performed by exposing the conductive layer to an etchant which attacks the second material but which does not substantially attack the first material.

6. A method as claimed in claim 5 wherein said step of providing said conductive layer with said masses of said first material includes the steps of providing a sheet of said second material, forming cavities in said sheet of said second material and depositing said first material in said cavities.

7. A method as claimed in claim 6 wherein said providing step further includes the step of forming said leads from said first material while depositing said first material in said cavities.

8. A method as claimed in claim 3 wherein one of said elements includes a wafer comprising a plurality of semiconductor chips, the method further comprising the step of severing said wafer after the aforesaid steps to provide individual units, each including one or more of said chips and the terminals and leads connected to such chip or chips.

9. A method as claimed in claim 1 wherein said providing step includes the step of providing said leads on said first element, so that a fixed end of each said lead is attached to said first element and then juxtaposing said first element with said second element and bonding free ends of said leads remote from the fixed ends thereof to said second element.

10. A method as claimed in claim 9 wherein each said lead has a fixed end permanently secured to said first element and a free end releasably secured to said first element prior to said bonding step and said moving step, and wherein the free ends of the leads are detached from said first element during said moving step.

11. A method as claimed in claim 1 or claim 3 or claim 10 wherein said providing step includes the step of holding said first element in a rigid frame, so that said frame and said conductive layer cooperatively maintain said leads in predetermined spatial relation to one another prior to said bonding step.

12. A method as claimed in claim 11 wherein said frame and said first element cooperatively define a recess open at one end and having said first element at the other end, said step of providing said compliant layer including the step of injecting a curable liquid material into said recess between said first and second elements so that said liquid material is at least partially confined by said frame, and then curing said liquid material in said recess.

13. A method as claimed in claim 1 or claim 3 or claim 10 wherein said conductive layer and said second element have substantially equal coefficients of thermal expansion.

14. A method as claimed in claim 9 wherein said first element includes a flexible dielectric layer having bottom and top surfaces, said conductive layer overlying said top surface of said dielectric layer, said leads extending along said bottom surface of said dielectric layer.

15. A method as claimed in claim 1 wherein said conductive layer is metallic.

16. A method as claimed in claim 1 wherein said step of providing a compliant layer is performed by injecting a curable liquid between said elements and around said leads prior to said step of removing potions of said conductive layer.

17. A method as claimed in claim 16 wherein said step of providing a compliant layer includes the step of curing said liquid to form a compliant material prior to said step of removing potions of said conductive layer.

18. A method as claimed in claim 17 wherein said providing step is performed so that each said lead has a fixed end connected directly to said conductive layer prior to said moving step, and wherein said step of removing potions of said conductive layer is performed so as to leave portions of said conductive layer directly connected to said leads as terminals supported by said compliant layer.

19. A method as claimed in claim 3 or claim 17 wherein said step of removing portions of said conductive layer is performed by etching the conductive layer.

20. A method as claimed in claim 19 wherein said step of removing portions of said conductive layer is performed so as to form said terminals to include a plurality of elongated posts extending generally vertically so that each such post has a base at a bottom end of the post closest to said leads and compliant layer and a top end furthest from said leads and compliant layer.

21. A method as claimed in claim 20 wherein conductive layer is metallic and wherein said step of etching the conductive layer includes the step of depositing spots of an etch-resistant material on said conductive layer and then exposing the conductive layer to an etching liquid.

22. A method as claimed in claim 20 wherein said step of exposing the conductive layer to an etching liquid is performed so as to form said posts with a cooling tower shape such that each said post has horizontal dimensions which decrease from a the bottom end of the post to a narrow region between the bottom and top ends and increase from said narrow region toward said top end.

23. A method of making a microelectronic assembly comprising the steps of:
 (a) providing a first element including an electrically conductive layer extending in horizontal directions, a second element spaced apart from said first element and a plurality of electrically conductive attachment elements extending between said first and second elements, at least some of said attachment elements being electrically connected to the conductive layer and at least some of said attachment elements being electrically connected to said second element;
 (b) providing a dielectric layer between said elements surrounding said attachment elements; and
 (c) removing portions of said conductive layer and leaving residual portions of said conductive layer so that the residual portions of said conductive layer form one or electrical parts of the assembly.

24. A method as claimed in claim 23 wherein one or more of said electrically conductive parts formed in said removing step are electrically connected to one or more of said attachment elements.

25. A method as claimed in claim 24 wherein said one or more electrically conductive parts formed in said removing step include a plurality of terminals electrically connected to at least some of said attachment elements.

26. A method as claimed in claim 23 wherein said step of providing said dielectric layer includes the step of injecting a liquid material around said attachment elements and curing said liquid material.

27. A method as claimed in claim 1 wherein said one or more conductive parts include a flexible conductive potential plane element extending in said horizontal directions.

28. A method as claimed in claim 1 wherein said one or more conductive parts include a one or more flexible leads extending in at least one said horizontal direction.

* * * * *

UNITED STATES PATENT AND TRADEMARK OFFICE
CERTIFICATE OF CORRECTION

PATENT NO. : 5,989,936
DATED : November 23, 1999
INVENTOR(S) : John W. Smith, Joseph Fjelstad It is certified that error appears in the above-identified patent and that said Letters Patent is hereby corrected as shown below:

Column 2, line 6, "a" should read --an--.
    Column 6, line 15, after "formed" insert "from".
    Column 6, line 16, cancel "form a such as".
    Column 8, line 48, cancel the word "forming".
    Column 10, line 22, "aground" should read "a ground".
    Column 11, line 29, "Filed" should read --filed--.
    Column 11, line 43, "a" should read --the--.
    Column 14, line 5, "is" (second occurrence) should read --it--.
    Column 15, line 48 "utilize" should read --utilized--.
    Column 17, line 43, after "wherein" insert --said--.
    Column 18, line 7, cancel the word "a" (first occurrence).
    Column 18, line 25, after "or" insert --more--.
    Column 18, line 43, cancel the word "a".

Signed and Sealed this

Seventeenth Day of October, 2000

Q. TODD DICKINSON

Attest:

*Attesting Officer*    *Director of Patents and Trademarks*